: (12) United States Patent
Nishi et al.

(10) Patent No.: US 7,271,670 B2
(45) Date of Patent: Sep. 18, 2007

(54) CR OSCILLATION CIRCUIT

(75) Inventors: Kazuyoshi Nishi, Kyoto (JP); Junji Takiguchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 61 days.

(21) Appl. No.: 11/270,597

(22) Filed: Nov. 10, 2005

(65) Prior Publication Data

US 2006/0109060 A1 May 25, 2006

(30) Foreign Application Priority Data

Nov. 10, 2004 (JP) ............................. 2004-326221
Sep. 27, 2005 (JP) ............................. 2005-280419

(51) Int. Cl.
H03K 3/02 (2006.01)
H03K 3/26 (2006.01)
H03B 7/00 (2006.01)

(52) U.S. Cl. ..................... 331/143; 331/111; 331/135; 331/57; 331/65; 331/185

(58) Field of Classification Search ................ 331/66, 331/65, 57, 108 R, 135, 156, 137, 11, 113 R, 331/143, 144, 108 C, 104, 185, 186, 176
See application file for complete search history.

(56) References Cited

U.S. PATENT DOCUMENTS 4,621,315 A * 11/1986 Vaughn et al. ................ 363/60
4,920,322 A * 4/1990 Ruijs ............................ 331/17
4,964,300 A * 10/1990 Kinard et al. ............. 73/170.25
5,982,247 A * 11/1999 Yoshizawa et al. ......... 331/143
6,163,225 A 12/2000 Sundaram et al.
2004/0075507 A1* 4/2004 Aoyama et al. ............ 331/176

FOREIGN PATENT DOCUMENTS

| JP | 57-087619 | 6/1982 |
| JP | 60-173918 | 9/1985 |
| JP | 63-116505 | 5/1988 |
| JP | 05-206731 | 8/1993 |
| JP | 06-104639 | 4/1994 |
| JP | 7-131301 | 5/1995 |
| JP | 09-018233 | 1/1997 |

* cited by examiner

*Primary Examiner*—Robert Pascal
*Assistant Examiner*—Ryan J Johnson
(74) *Attorney, Agent, or Firm*—McDermott Will & Emery LLP

(57) ABSTRACT

A CR oscillation circuit comprises first and second logic elements, a capacitive element, and a resistive element. The first logic element is connected between a first node and a second node. The second logic element is connected between the second node and a third node. The capacitive element is connected between the first node and the second node. The resistive element is connected between the first node and the third node. The capacitive element includes a well, a diffusion layer, a gate electrode and a gate oxide film. The capacitive element has a voltage-dependence characteristic such that its capacitance value varies according to the variation in a supply voltage. The capacitance value of the capacitive element decreases when the on-resistance of the first and second logic elements increases according to the variation in the supply voltage.

17 Claims, 12 Drawing Sheets

CR OSCILLATION CIRCUIT

CROSS-REFERENCE TO RELATED APPLICATIONS

This application claims priority under 35 U.S.C. §119(a) on Japanese Patent Application No. 2004-326221 filed on Nov. 10, 2004 and Japanese Patent Application No. 2005-280419 filed on Sep. 27, 2005, the entire contents of which are hereby incorporated by reference.

BACKGROUND OF THE INVENTION

1. Field of the Invention

The present invention relates to a CR oscillation circuit which generates a clock having a frequency determined according to the resistance value and capacitance value.

2. Description of the Prior Art

FIG. 12 shows a structure of a conventional CR oscillation circuit. The CR oscillation circuit includes inverters 91, 92 and 93, a capacitive element 94, and a resistive element 95. This circuit outputs clock CLK which has a frequency determined according to a product of the capacitance value of the capacitive element 94 and the resistance value of the resistive element 95 (see, for example, Japanese Laid-Open Patent Publication No. 5-206731 and Japanese Laid-Open Patent Publication No. 7-131301).

Clock CLK generated by the CR oscillation circuit is used as, for example, a display control clock for driving display elements provided over a display panel, such as a liquid crystal panel, or the like. It has been generally known that, if the frequency of the display control clock is varied, the timing of driving the display elements is also varied, so that flickers are seen in a representation of the display panel.

However, to keep the frequency of clock CLK constant as much as possible, the capacitive element 94 is desirably formed using a material which exhibits only a small variation in capacitance value even in the case of a variation in the supply voltage (a material having a small voltage-dependence characteristic). For example, the interpolysilicon (polysilicon-to-polysilicon) capacitance or intermetal (metal-to-metal) capacitance is used as the capacitive element 94. The resistive element 95 is desirably formed using a material which exhibits only a small variation in resistance value even in the case of a variation in the supply voltage (a material having a small voltage-dependence characteristic) and which exhibits only a small variation in resistance value even in the case of a variation in temperature (a material having a small temperature-dependence characteristic). For example, a polysilicon resistance is used as the resistive element 95.

However, since the polysilicon resistance has a small temperature-dependence characteristic, the frequency of clock CLK varies according to a variation in the operating temperature or environmental temperature of a semiconductor integrated circuit device incorporating the CR oscillation circuit.

In the case of using the interpolysilicon capacitance or intermetal capacitance, an additional step for forming the capacitance in a semiconductor integrated circuit (an exclusive polysilicon formation step for forming a second layer capacitance or an exclusive metal formation step for forming an intermetal capacitance) is necessary. Thus, the cost of the semiconductor integrated circuit increases.

Transistors included in the inverters 91, 92 and 93 also have the voltage-dependence characteristic, and therefore, the frequency of clock CLK varies due to a variation in the supply voltage. As a result, flickers occur in a representation of the display.

SUMMARY OF THE INVENTION

In view of the above, an objective of the present invention is to suppress a variation in clock frequency due to a voltage variation or temperature variation.

According to one aspect of the present invention, a CR oscillation circuit comprises a first logic element, a second logic element, a capacitive element, and a resistive element. The first logic element has an input terminal connected to a first node and an output terminal connected to a second node. The second logic element has an input terminal connected to the second node and an output terminal connected to a third node. The capacitive element is connected between the first node and the second node in parallel with the first logic element. The resistive element is connected between the first node and the third node in parallel with the first and second logic elements. The capacitive element includes a well, a diffusion layer, a gate electrode and a gate oxide film. The well is formed in a semiconductor substrate. The diffusion layer is formed in the well and is electrically connected to any one of the first node and the second node. The gate electrode is formed on the well and the diffusion layer and is electrically connected to the other one of the first node and the second node. The gate oxide film is formed between the well and the gate electrode. Each of the first and second logic elements has a voltage-dependence characteristic such that its on-resistance varies according to a variation in a supply voltage. The capacitive element has a voltage-dependence characteristic such that its capacitance value varies according to the variation in the supply voltage. The capacitance value of the capacitive element decreases when the on-resistance of the first and second logic elements increases according to the variation in the supply voltage.

In the above CR oscillation circuit, the voltage-dependence characteristic of the first and second logic elements is suppressed by the voltage-dependence characteristic of the capacitive element, whereby a variation in clock frequency is suppressed.

According to another aspect of the present invention, a CR oscillation circuit comprises a first logic element, a second logic element, a capacitive element, and a resistive element. The first logic element has an input terminal connected to a first node and an output terminal connected to a second node. The second logic element has an input terminal connected to the second node and an output terminal connected to a third node. The capacitive element is connected between the first node and the second node in parallel with the first logic element. The resistive element is connected between the first node and the third node in parallel with the first and second logic elements. The resistive element includes a diffused resistor. The diffused resistor is formed in a semiconductor substrate and is electrically connected to each of the first node and the third node. Each of the first and second logic elements has a voltage-dependence characteristic such that its on-resistance varies according to a variation in a supply voltage. The resistive element has a voltage-dependence characteristic such that its resistance value varies according to the variation in the supply voltage. The resistance value of the resistive element decreases when the on-resistance of the first and second logic elements increases according to the variation in the supply voltage.

In the above CR oscillation circuit, the voltage-dependence characteristic of the first and second logic elements is suppressed by the voltage-dependence characteristic of the resistive element, whereby a variation in clock frequency is suppressed.

According to still another aspect of the present invention, a CR oscillation circuit comprises a first logic element, a second logic element, a capacitive element, and a resistive element. The first logic element has an input terminal connected to a first node and an output terminal connected to a second node. The second logic element has an input terminal connected to the second node and an output terminal connected to a third node. The capacitive element is connected between the first node and the second node in parallel with the first logic element. The resistive element is connected between the first node and the third node in parallel with the first and second logic elements. The resistive element includes a diffused resistor. The diffused resistor is formed in a semiconductor substrate and is electrically connected to each of the first node and the third node. Each of the first and second logic elements has a temperature-dependence characteristic such that its on-resistance varies according to a temperature variation. The resistive element has a temperature-dependence characteristic such that its resistance value varies according to the temperature variation. The resistance value of the resistive element decreases when the on-resistance of the first and second logic elements increases according to the temperature variation.

In the above CR oscillation circuit, the temperature-dependence characteristic of the first and second logic elements is suppressed by the temperature-dependence characteristic of the resistive element, whereby a variation in clock frequency is suppressed.

DESCRIPTION OF THE PREFERRED EMBODIMENTS

Figure 1:
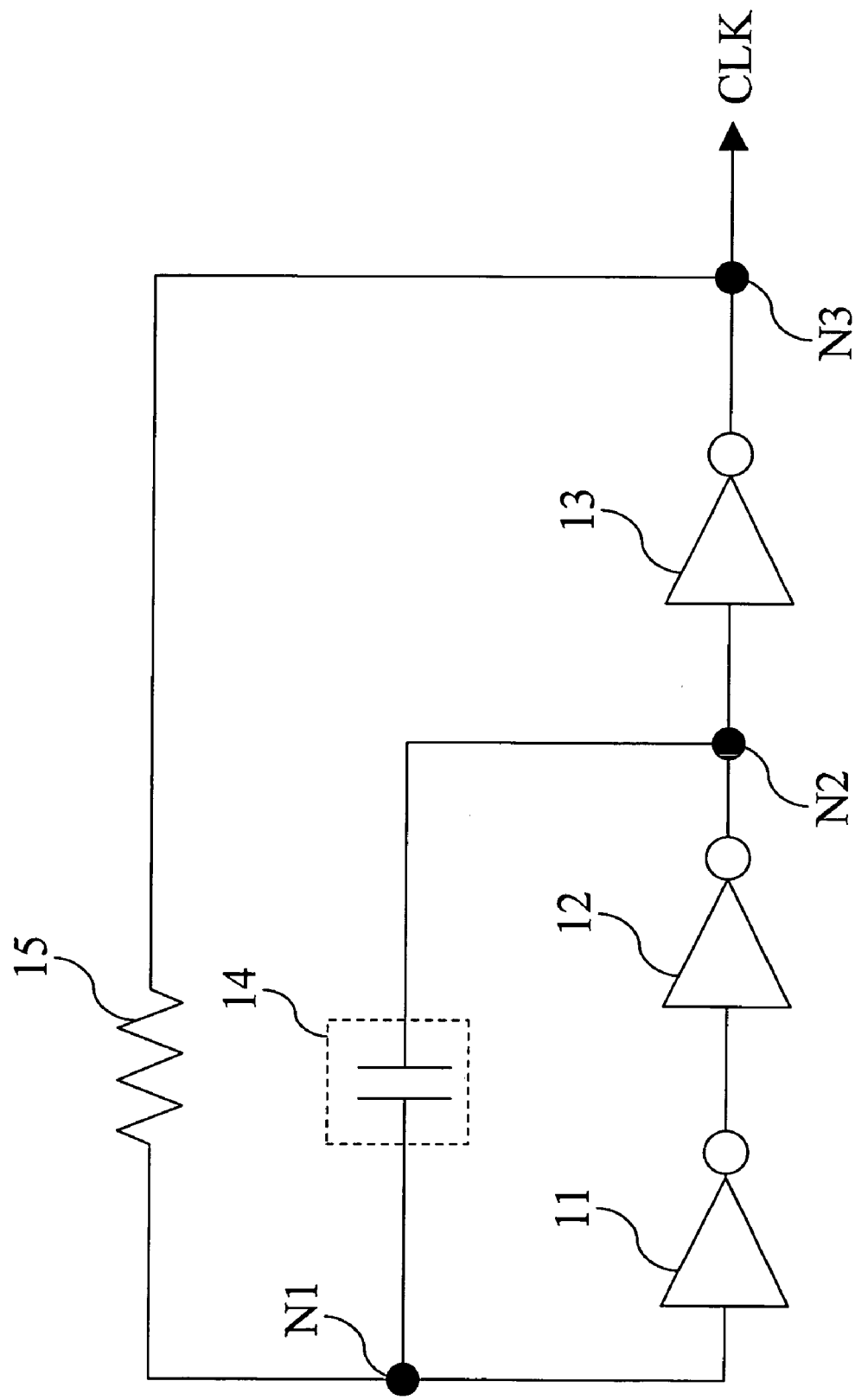
FIG. 1 is a circuit diagram showing the structure of a CR oscillation circuit according to embodiment 1 of the present invention.

Hereinafter, embodiments of the present invention will be described in detail with reference to the drawings. Throughout the drawings, the same or equivalent parts are denoted by the same reference numerals, and hence, detailed descriptions thereof are not repeated.

Embodiment 1

<Structure>

FIG. 1 is a circuit diagram of a CR oscillation circuit according to embodiment 1 of the present invention. This circuit includes inverters 11, 12 and 13, a capacitive element 14, and a resistive element 15. The inverters 11, 12 and 13 are connected in series between a node N1 and a node N3. The capacitive element 14 is connected between the node N1 and a node N2, which is a connection node between the inverter 12 and the inverter 13, in parallel with the inverters 11 and 12. The resistive element 15 is connected between the node N1 and the node N3 in parallel with the inverters 11, 12 and 13. The resistive element 15 is, for example, a polysilicon resistance.

In the CR oscillation circuit having such a structure, it has been generally known that the frequency of clock CLK output therefrom can be calculated by the formula of "$1/(2.2 \times C \times R)$" where C is the capacitance value of the capacitive element 14 and R is the resistance value of the resistive element 15. It should be noted that various parasitic capacitances produced between wires and a substrate have to be included in "C" of the formula, and the on-resistance of transistors included in the inverters 11, 12 and 13, and the like, has to be included in "R" of the formula.

In general, the on-resistance of the transistors included in the inverters 11, 12 and 13 increases or decreases as the supply voltage supplied to the inverters 11, 12 and 13 increases. That is, the inverters 11, 12 and 13 have a characteristic such that the resistance value of the on-resistance varies according to a variation in the supply voltage (voltage-dependence characteristic). In the present specification, as for the inverters 11, 12 and 13, a characteristic such that the resistance value of the on-resistance decreases according to an increase of the supply voltage is referred to as "negative voltage-dependence characteristic", and a characteristic such that the resistance value of the on-resistance increases according to an increase of the supply voltage is referred to as "positive voltage-dependence characteristic".

For example, in the case where the inverters 11, 12 and 13 have the negative voltage-dependence characteristic, the clock frequency increases according to an increase of the supply voltage.

<Capacitive Element>

Figure 2A:
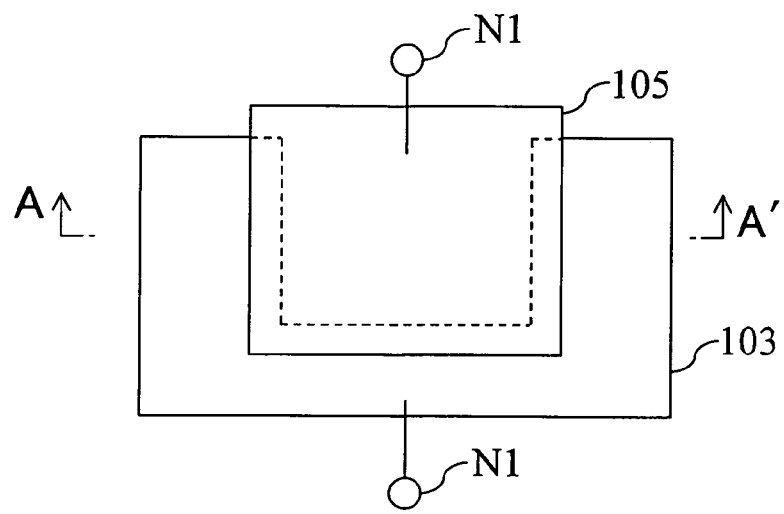
FIG. 2A is a top view of a capacitive element shown in FIG. 1.
Figure 2B:
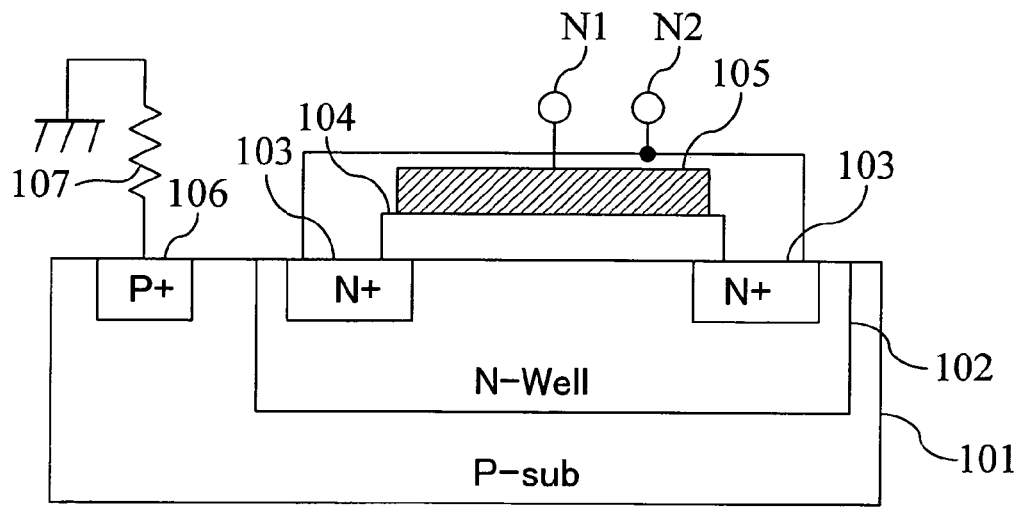
FIG. 2B is a cross-sectional view of the capacitive element shown in FIG. 2A.

FIG. 2A is a top view of the capacitive element 14 shown in FIG. 1. FIG. 2B is a cross-sectional view of the capacitive element 14. In the capacitive element 14, a semiconductor substrate 101 includes a well 102. The well 102 includes a diffusion layer 103. A gate oxide film 104 is provided on the well 102 and the diffusion layer 103. A gate electrode 105 is provided on the gate oxide film 104. The diffusion layer 103 is electrically connected to the node N1. The gate electrode 105 is formed of, for example, polysilicon and is electrically connected to the node N2. The semiconductor substrate 101 also includes a diffusion layer 106. The diffusion layer 106 is connected to a ground potential through a resistance 107. It should be noted that only the diffusion layer 103 and the gate electrode 105 are shown in FIG. 2A. In FIG. 2A and FIG. 2B, the semiconductor substrate 101 and the diffusion layer 106 are of "P-type", while the well 102, the diffusion layer 103, and the gate electrode 105 are of "N-type".

Figure 2C:
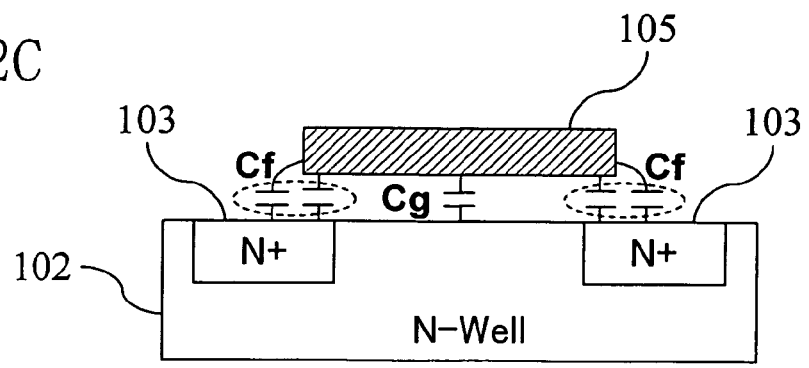
FIG. 2C illustrates the characteristics of the capacitive element.

Next, capacitance components produced in the capacitive element 14 are described with reference to FIG. 2C. Herein, the capacitance component produced between the well 102 and the gate electrode 105 is gate capacitance Cg.

The gate capacitance Cg exhibits the "positive voltage-dependence characteristic" or "negative voltage-dependence characteristic". In the capacitive element 14, the "positive voltage-dependence characteristic" means a characteristics such that the capacitance value of the capacitive element 14 increases according to an increase of the supply voltage, and the "negative voltage-dependence characteristic" means a characteristics such that the capacitance value of the capacitive element 14 decreases according to an increase of the supply voltage.

The polarity of the voltage-dependence characteristic the gate capacitance Cg exhibits is set by adjusting various conditions (parameters) in the structure of the capacitive element 14 and the semiconductor fabrication process so as to uniquely have any one of the "positive voltage-dependence characteristic" and the "negative voltage-dependence characteristic". For example, it has been confirmed that, under a specific fabrication condition, if the diffusion layer 103 is of "N-type" and the well 102 is of "N-type", the gate capacitance Cg exhibits "positive voltage-dependence characteristic"; whereas if the diffusion layer 103 is of "P-type" and the well 102 is of "P-type", the gate capacitance Cg exhibits "negative voltage-dependence characteristic".

Meanwhile, edge capacitance Cf is produced between the diffusion layer 103 and the gate electrode 105. The edge capacitance Cf includes an overlap capacitance and a fringe capacitance. The edge capacitance Cf scarcely exhibits the voltage-dependence characteristics.

The variation amount as to the voltage-dependence characteristic of the capacitive element 14 (the variation amount of the capacitance value of the capacitive element 14 which is determined according to the variation amount of the supply voltage) can be arbitrarily set by adjusting the ratio between the gate capacitance Cg and the edge capacitance Cf. For example, if the gate capacitance Cg occupies a larger part than the edge capacitance Cf does, the variation amount as to the voltage-dependence characteristic of the capacitive element 14 increases. The ratio between the gate capacitance Cg and the edge capacitance Cf is determined by the relative disposition of the gate electrode 105 and the diffusion layer 103.

Figure 3B:
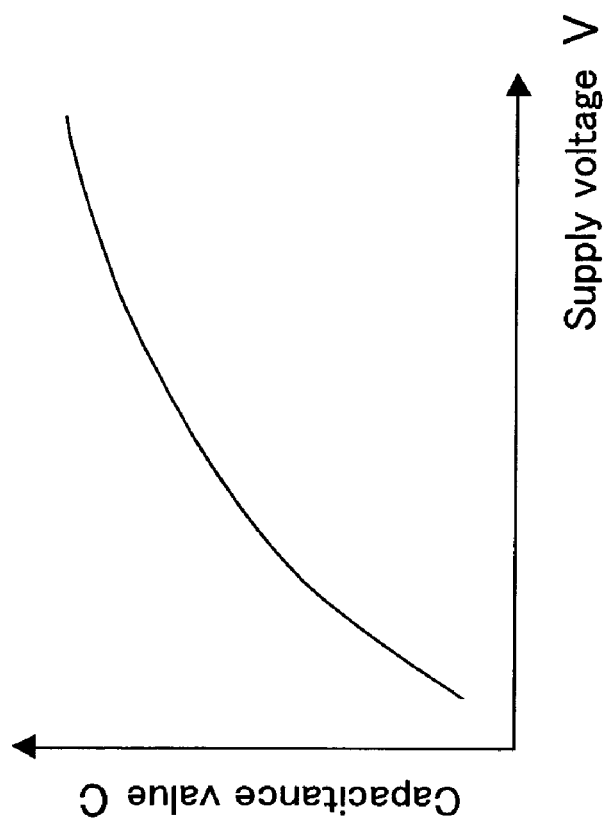
FIG. 3B is a graph showing the voltage-dependence characteristic of the capacitive element shown in FIG. 1.
Figure 3A:
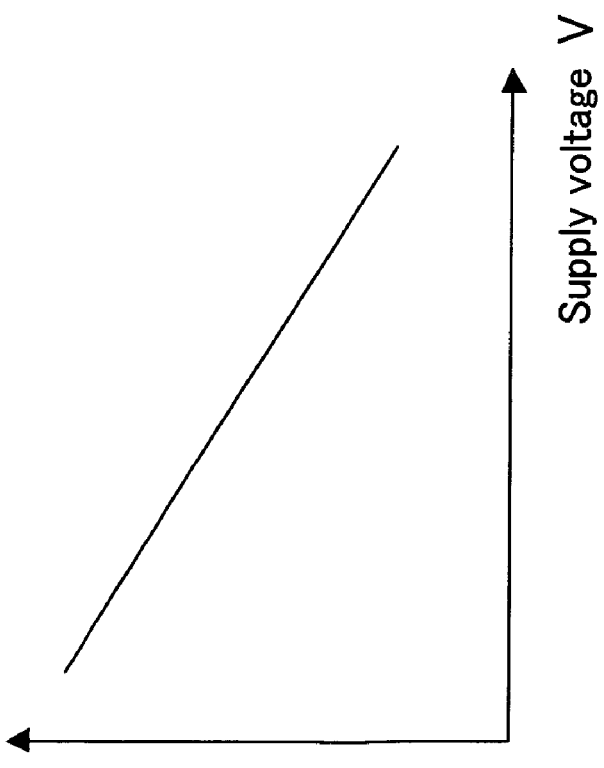
FIG. 3A is a graph showing the voltage-dependence characteristic of inverters shown in FIG. 1.

In the case where the inverters 11, 12 and 13 have the "negative voltage-dependence characteristic" as shown in FIG. 3A, the capacitive element 14 is formed to have the "positive voltage-dependence characteristic" as shown in FIG. 3B. By adjusting the ratio between the gate capacitance Cg and the edge capacitance Cf according to the variation amount as to the voltage-dependence characteristic of the inverters 11, 12 and 13 (the variation amount of the on-resistance which is determined according to the variation amount of the supply voltage), the negative voltage-dependence characteristic of the inverters 11, 12 and 13 can be canceled.

In this way, the voltage-dependence characteristic of the inverters 11, 12 and 13 can be suppressed, and therefore, the variation in clock frequency can also be suppressed. Thus, for example, when the above-described CR oscillation circuit is used for the purpose of driving display elements provided over a display device, a plurality of driver lines connected to the plurality of display elements can be driven at a uniform timing, so that flickers are prevented in a representation over the display device.

It should be noted that each of the semiconductor substrate, well, diffusion layer, and gate electrode of the capacitive element 14 may be of any of "N-type" and "P-type".

<Adjustment of Characteristics of Capacitive Element>

Now, two examples of means for adjusting the ratio between the gate capacitance Cg and the edge capacitance Cf in the capacitive element 14 are described below.

<<Rectangular Opening>>

First, an example of the adjustment of the capacitance ratio by forming a rectangular opening in a gate electrode is described with reference to FIG. 4A to FIG. 4C.

Figure 4A:
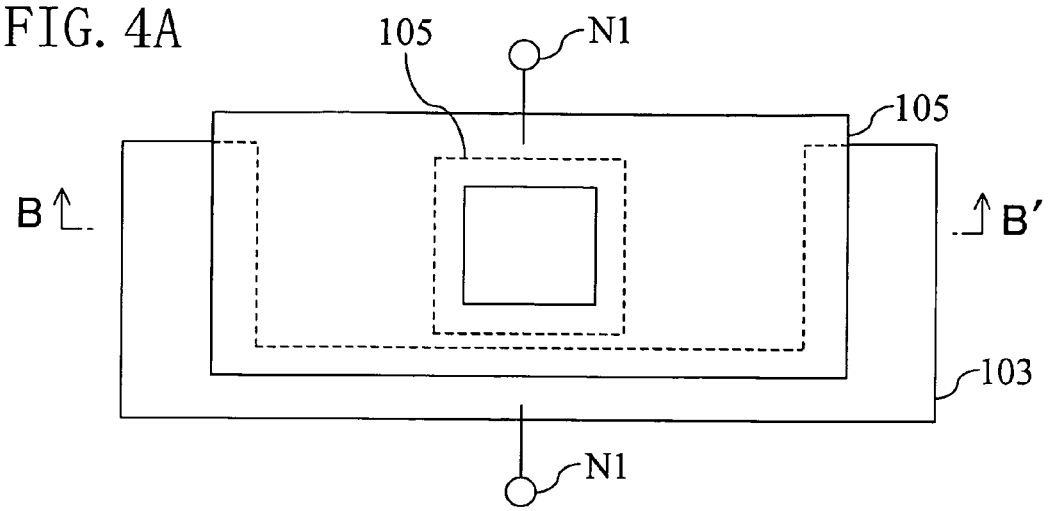
FIG. 4A is a top view of a capacitive element where an opening is formed in a gate electrode.
Figure 4B:
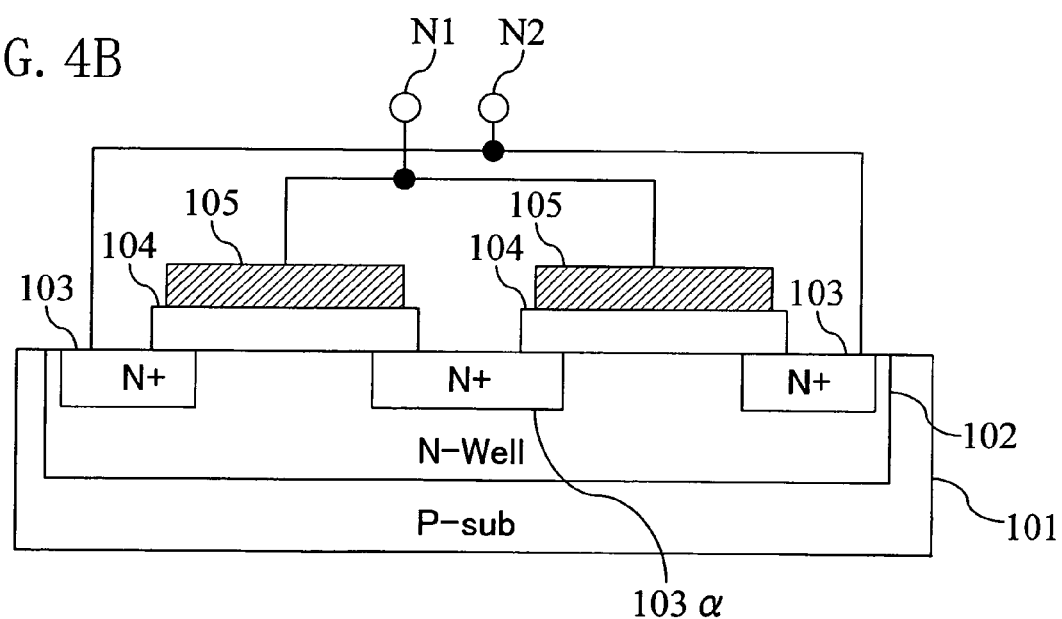
FIG. 4B is a cross-sectional view of a capacitive element shown in FIG. 4A.
Figure 4C:
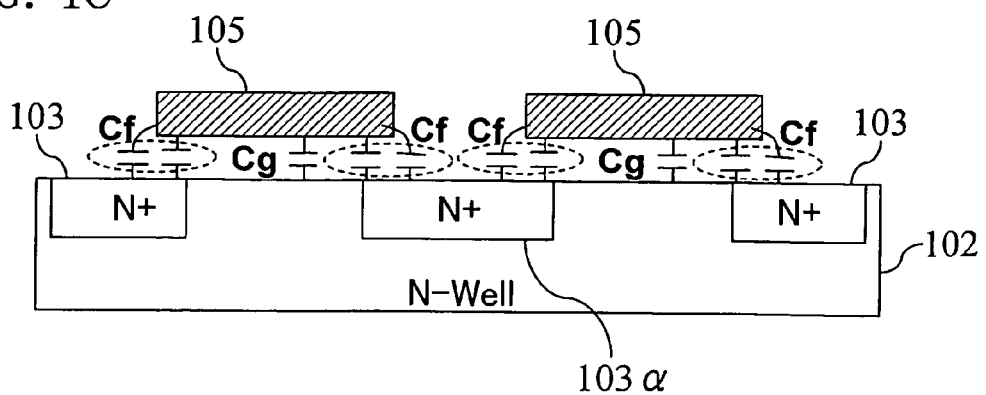
FIG. 4C illustrates the characteristics of the capacitive element.

When a rectangular opening is formed in the gate electrode 105 of FIG. 2A and FIG. 2B as shown in FIG. 4A and FIG. 4B, the area of the gate electrode 105 decreases. Accordingly, the gate capacitance Cg produced between the gate electrode 105 and the well 102 decreases. Therefore, the variation amount as to the voltage-dependence characteristic represented by the gate capacitance Cg decreases, so that the variation amount as to the voltage-dependence characteristic of the capacitive element 14 also decreases. If a new diffusion layer 103a is formed in the well 102, a new edge capacitance Cf is produced between the gate electrode 105 and the diffusion layer 103a. Thus, the edge capacitance Cf produced in the capacitive element 14 increases. In this way, the ratio between the gate capacitance Cg and the edge capacitance Cf is changed.

Herein, by adjusting the number of openings formed in the gate electrode 105 according to the variation amount as to the voltage-dependence characteristic of the inverters 11, 12 and 13, the voltage-dependence characteristic of the inverters 11, 12 and 13 can be canceled by the voltage-dependence characteristic of the capacitive element 14.

It should be noted that the shape of the opening formed in the gate electrode 105 is not limited to rectangular.

<<Strip-shaped Gate Electrode>>

Next, an example of the adjustment of the capacitance ratio by forming a gate electrode in the shape of a strip is described with reference to FIG. 5A and FIG. 5B.

Figure 5A:
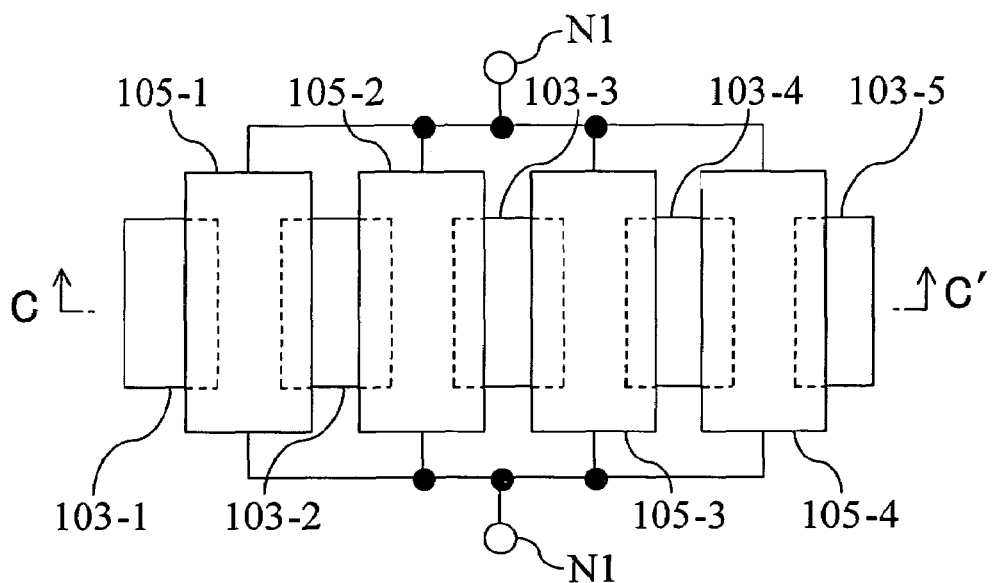
FIG. 5A is a top view of a capacitive element where a gate electrode has the shape of a strip.

FIG. 5A is a top view of the capacitive element 14 of this example. FIG. 5B is a cross-sectional view of the capacitive element 14 of this example. In this example, the capacitive element 14 includes gate electrodes 105-1 to 105-4 and diffusion layers 103-1 to 103-5 in place of the gate electrode 105 and diffusion layer 103 shown in FIG. 2A and FIG. 2B. The other parts of the structure are the same as those shown in FIG. 2A and FIG. 2B. It should be noted that FIG. 5B shows a portion that includes the diffusion layers 103-1 to 103-3.

Produced between each of the gate electrodes 105-1 to 105-4 and the well 102 is gate capacitance Cg. Produced between the gate electrode 105-1 and each of the diffusion layers 103-1 and 103-2 is edge capacitance Cf. As for each of the gate electrodes 105-2 to 105-4, edge capacitance Cf is produced between its gate electrode and a diffusion layer corresponding thereto as is for the gate electrode 105-1. That is, gate capacitance Cg and edge capacitance Cf are produced for each gate electrode. Thus, the ratio between the gate capacitance Cg and the edge capacitance Cf can be changed by interrupting supply of voltage to the gate electrode or fixing the potential of the gate electrode to negate the gate capacitance Cg.

Herein, by adjusting the number of gate electrode to which the voltage is supplied according to the variation amount as to the voltage-dependence characteristic of the inverters 11, 12 and 13, the voltage-dependence characteristic of the inverters 11, 12 and 13 can be canceled by the voltage-dependence characteristic of the capacitive element 14.

Figure 5B:
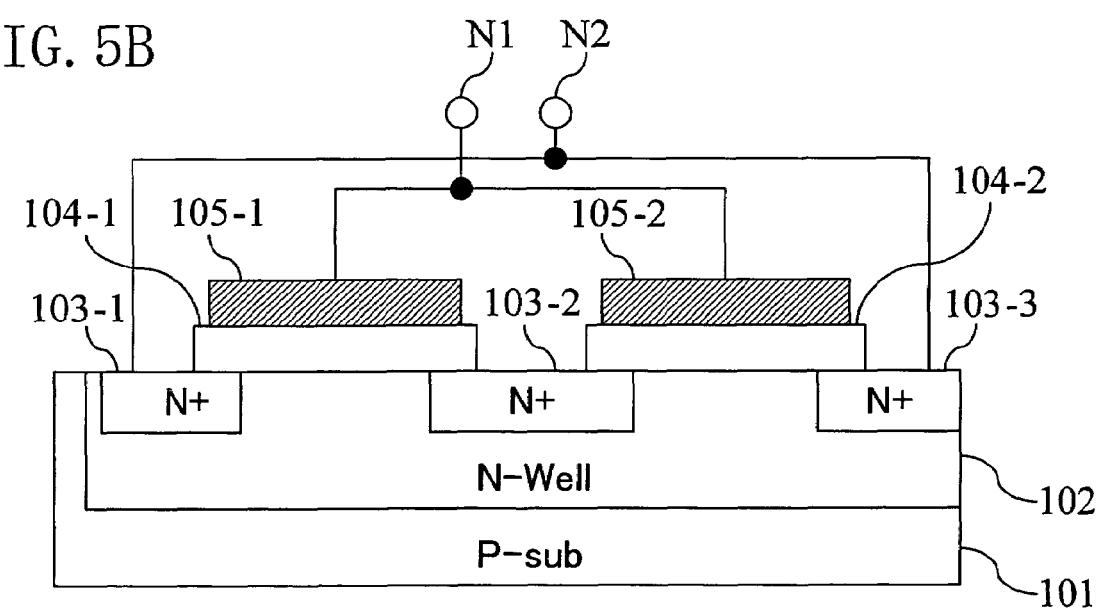
FIG. 5B is a cross-sectional view of a capacitive element shown in FIG. 5A.

It should be noted that the structure shown in FIG. 5A and FIG. 5B includes four gate electrodes and five diffusion layers, but the present invention is not limited to these numbers.

<Effects of Diffusion Layer 106 and Resistance 107>

Next, the effects of the diffusion layer 106 and resistance 107 shown in FIG. 2B are described. When the diffusion layer 106 and resistance 107 are formed as shown in FIG. 2B, the impedance of a potential supplied to the semiconductor substrate 101 is high. Thus, the effects of the parasitic capacitances produced between the semiconductor substrate 101 and the well 102 are suppressed. As a result, a variation in clock frequency can be further suppressed.

In FIG. 2B, since the semiconductor substrate 101 is of "P-type" and the well 102 is of "N-type", the resistance 107 which is electrically connected to the diffusion layer 106 of "P-type" is connected to the ground potential. However, if the semiconductor substrate 101 is of "N-type" and the well 102 is of "P-type", the same effects can be achieved so long as the resistance 107 which is electrically connected to the diffusion layer 106 of "N-type" is connected to the supply potential.

Embodiment 2

<Structure>

Figure 6:
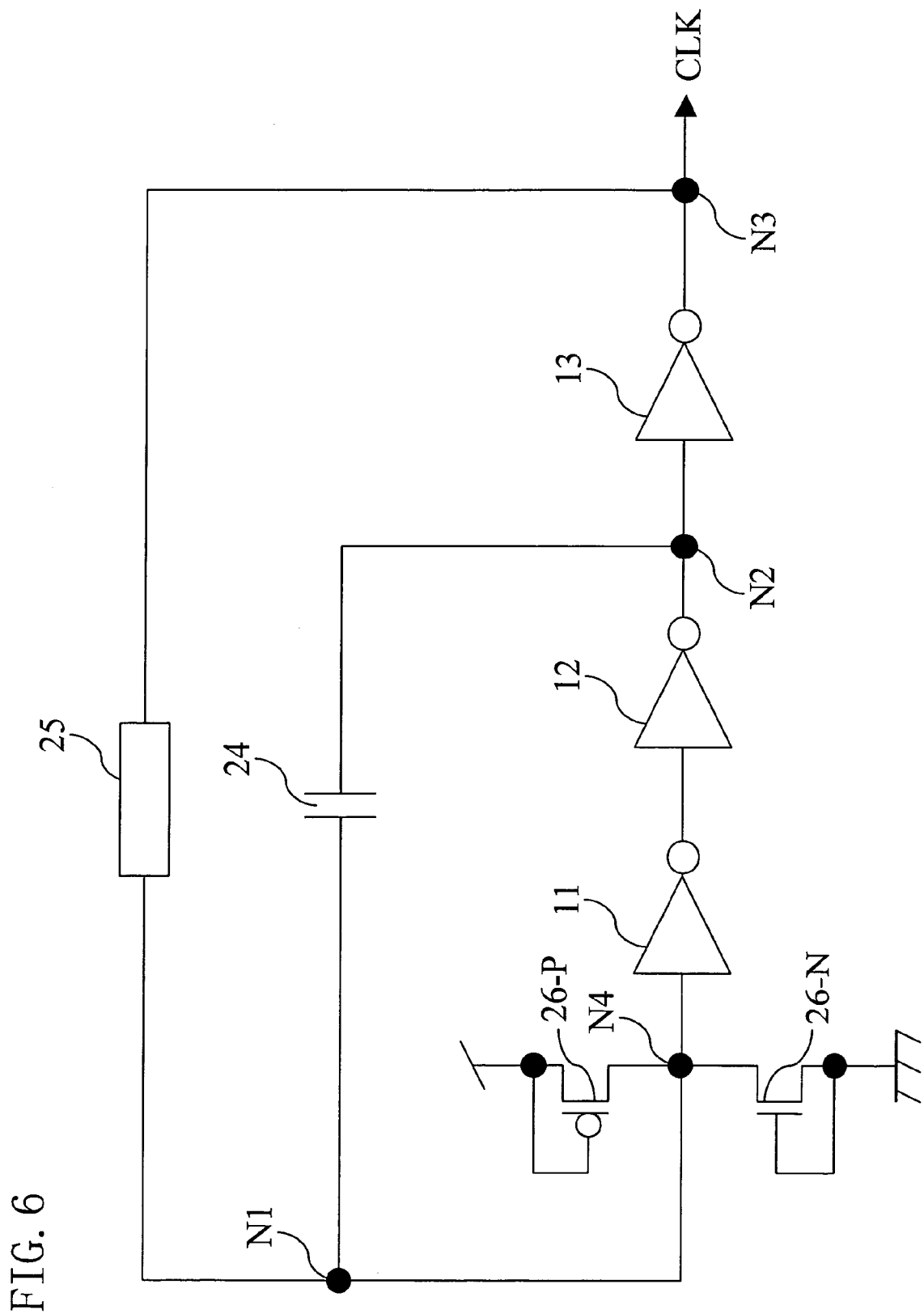
FIG. 6 is a circuit diagram showing the structure of a CR oscillation circuit according to embodiment 2 of the present invention.

FIG. 6 shows the structure of a CR oscillation circuit according to embodiment 2 of the present invention. The CR oscillation circuit of embodiment 2 includes a capacitive element 24 and a resistive element 25 in place of the capacitive element 14 and the resistive element 15 of FIG. 1. The CR oscillation circuit further includes a P-type MOS transistor 26-P and an N-type MOS transistor 26-N. The other parts of the structure are the same as those of FIG. 1. The capacitive element 24 may be, for example, an interlayer capacitance, such as an interpolysilicon capacitance or intermetal capacitance, or may alternatively be the capacitive element (gate oxide film capacitance) shown in FIG. 2, FIG. 4 or FIG. 5. The P-type MOS transistor 26-P is connected between a node N4 and a power supply node, and the source and gate of the P-type MOS transistor 26-P are connected to each other. The N-type MOS transistor 26-N is connected between the node N4 and a ground node, and the source and gate of the N-type MOS transistor 26-N are connected to each other.

<Resistive Element>

The resistive element 25 shown in FIG. 6 is described with reference to FIG. 7. The resistive element 25 is a diffused resistor formed in the semiconductor substrate 101.

The diffused resistor 201 has "positive voltage-dependence characteristic" or "negative voltage-dependence characteristic". In the resistive element 25, the "positive voltage-dependence characteristic" means a characteristic such that the resistance value of the resistive element 25 increases according to an increase of the supply voltage, and the "negative voltage-dependence characteristic" means a characteristic such that the resistance value of the resistive element 25 decreases according to an increase of the supply voltage. The polarity of the voltage-dependence characteristic the diffused resistor 201 has can be arbitrarily set by adjusting the diffusion process. For example, if the diffused resistor 201 is of "P-type", the diffused resistor 201 has "positive voltage-dependence characteristic"; whereas if the diffused resistor 201 is of "N-type", the diffused resistor 201 has "negative voltage-dependence characteristic". The variation amount as to the voltage-dependence characteristic of the diffused resistor 201 can also be arbitrarily set by adjusting the diffusion process.

The diffused resistor 201 has "positive temperature-dependence characteristic" or "negative temperature-dependence characteristic". In the resistive element 25, the "positive temperature-dependence characteristic" means a characteristic such that the resistance value of the resistive element 25 increases according to an increase in temperature, and the "negative temperature-dependence characteristic" means a characteristic such that the resistance value of the resistive element 25 decreases according to an increase in temperature. The polarity of the temperature-dependence characteristic and the variation amount as to the temperature-dependence characteristic of the diffused resistor 201 can be arbitrarily set by adjusting the diffusion process as can be for the voltage-dependence characteristic.

Figure 8B:
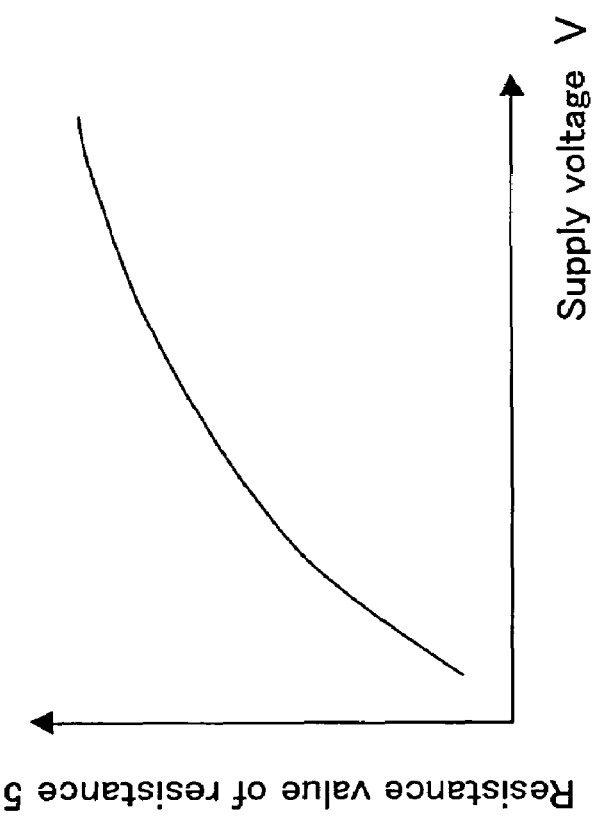
FIG. 8B is a graph showing the voltage-dependence characteristic of the resistive element shown in FIG. 6.
Figure 8A:
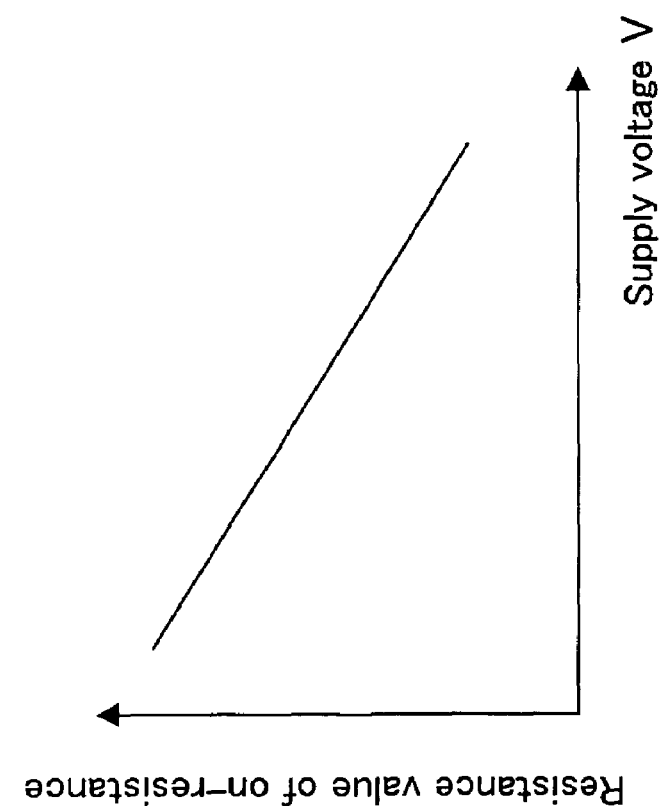
FIG. 8A is a graph showing the voltage-dependence characteristic of inverters shown in FIG. 6.

In the case where the inverters 11, 12 and 13 have the "negative voltage-dependence characteristic" as shown in FIG. 8A, the resistive element 25 is formed to have the "positive voltage-dependence characteristic" as shown in FIG. 8B. By adjusting the variation amount as to the voltage-dependence characteristic of the resistive element 25 according to the variation amount as to the voltage-dependence characteristic of the inverters 11, 12 and 13, the voltage-dependence characteristic of the inverters 11, 12 and 13 can be canceled by the voltage-dependence characteristic of the resistive element 25. As a result, a variation in clock frequency can be suppressed.

Figure 9B:
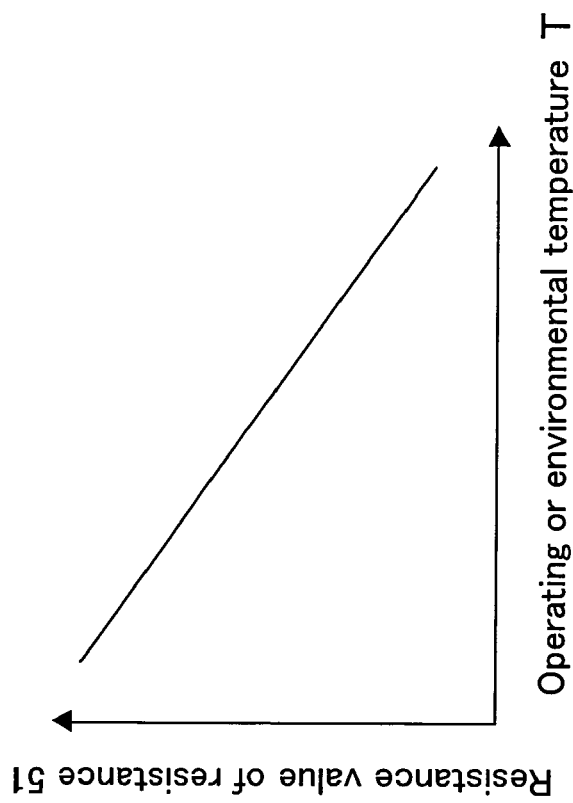
FIG. 9B is a graph showing the temperature-dependence characteristic of the resistive element shown in FIG. 6.
Figure 9A:
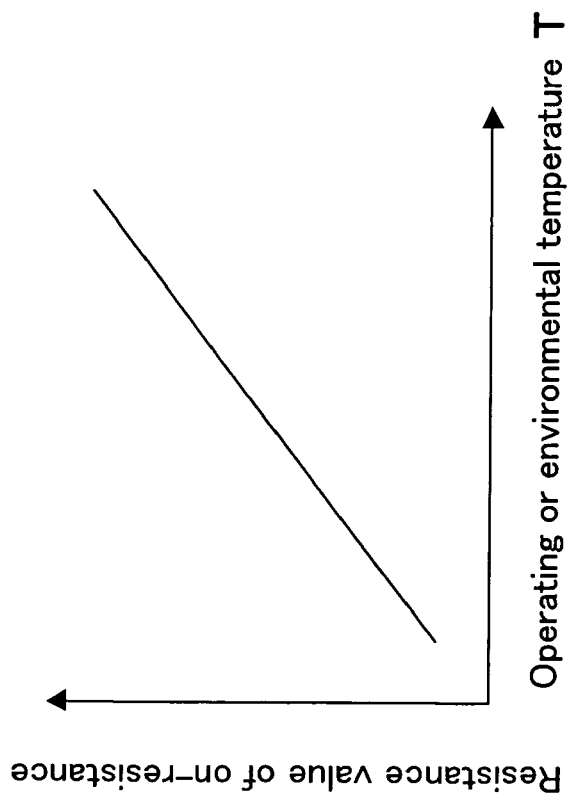
FIG. 9A is a graph showing the temperature-dependence characteristic of the inverters shown in FIG. 6.

In the case where the inverters 11, 12 and 13 have the "negative voltage-dependence characteristic" as shown in FIG. 9A, the resistive element 25 is formed to have the "positive voltage-dependence characteristic" as shown in FIG. 9B. By adjusting the variation amount as to the voltage-dependence characteristic of the resistive element 25 according to the variation amount as to the temperature-dependence characteristic of the inverters 11, 12 and 13, the voltage-dependence characteristic of the inverters 11, 12 and 13 can be canceled by the voltage-dependence characteristic of the resistive element 25. As a result, a variation in clock frequency can be suppressed.

<Adjustment of Characteristic of Resistive Element>

Now, means for adjusting the variation amount as to the voltage-dependence characteristic (or temperature-dependence characteristic) of the resistive element 25 is described. The voltage-dependence characteristic (or temperature-dependence characteristic) of the resistive element 25 can be adjusted by combination of a plurality of resistors which constitute the resistive element 25. Typical examples of this adjustment are shown in FIG. 10A to FIG. 10C.

Figure 7:
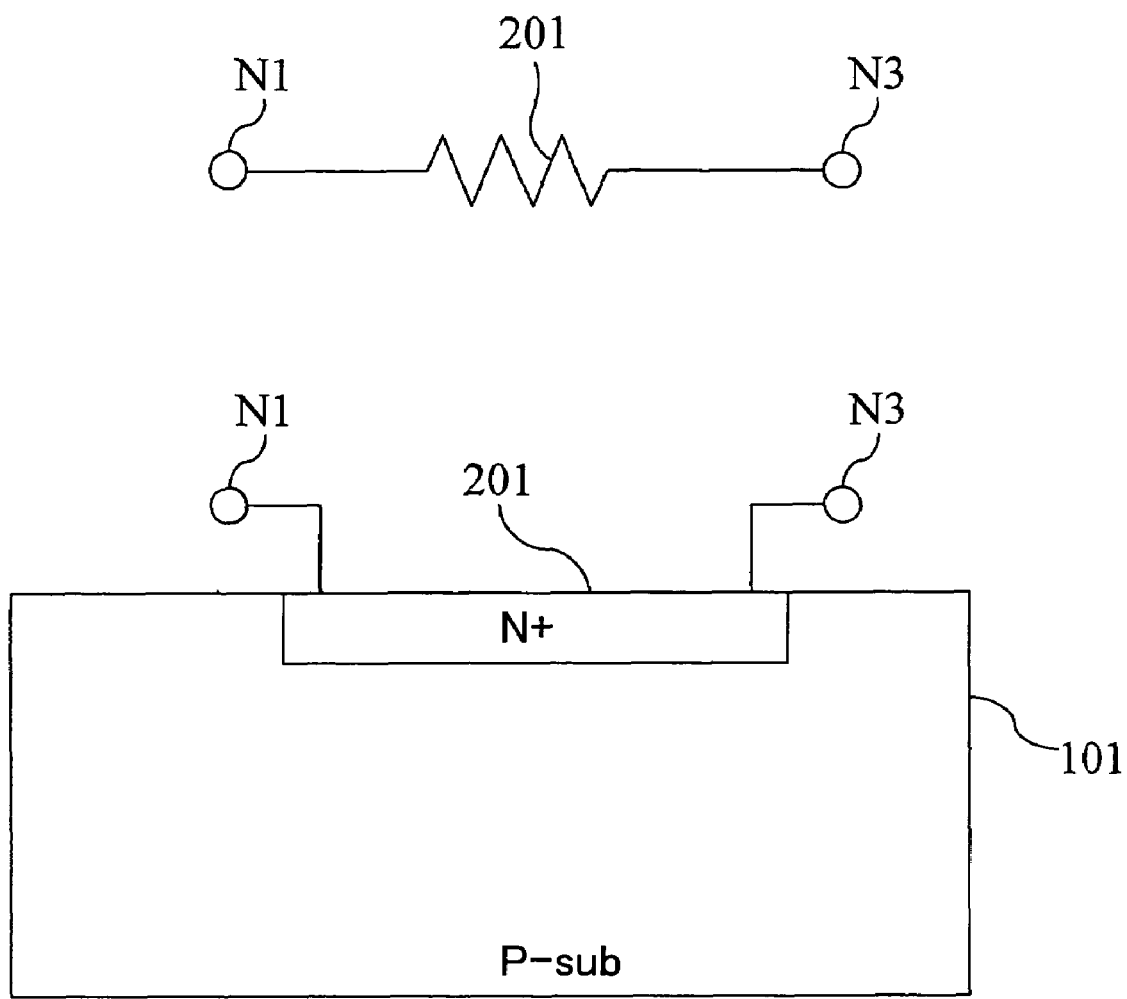
FIG. 7 illustrates a resistive element shown in FIG. 6.
Figure 10A:
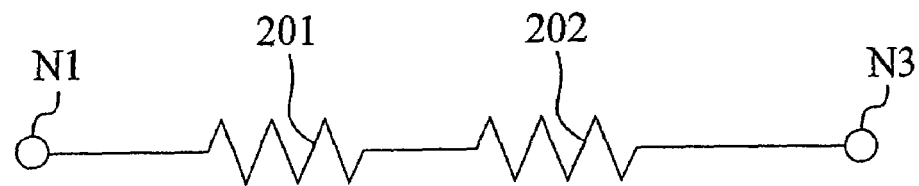
FIG. 10 illustrates an example of the structure of the resistive element shown in FIG. 6.
Figure 10B:
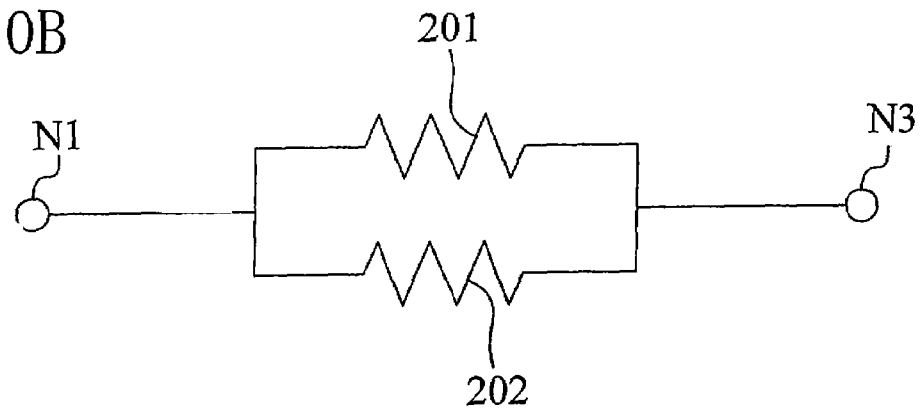

In the example of FIG. 10A, the resistive element 25 includes the diffused resistor 201 shown in FIG. 7 and a resistor 202. The diffused resistor 201 and the resistor 202 are connected in series between the node N1 and the node N3. In the example of FIG. 10B, the diffused resistor 201 and the resistor 202 are connected in parallel between the node N1 and the node N3. The resistor 202 has a voltage-dependence characteristic (or temperature-dependence characteristic) opposite to that of the diffused resistor 201. For example, if the diffused resistor 201 is of "N-type", the resistor 202 is a diffused resistor of "P-type". Alternatively, the resistor 202 may be a polysilicon resistor.

Thus, the characteristic of the diffused resistor 201 can be attenuated by the resistor 202, and therefore, the characteristic of the resistive element 25 can be adjusted arbitrarily.

Figure 10C:
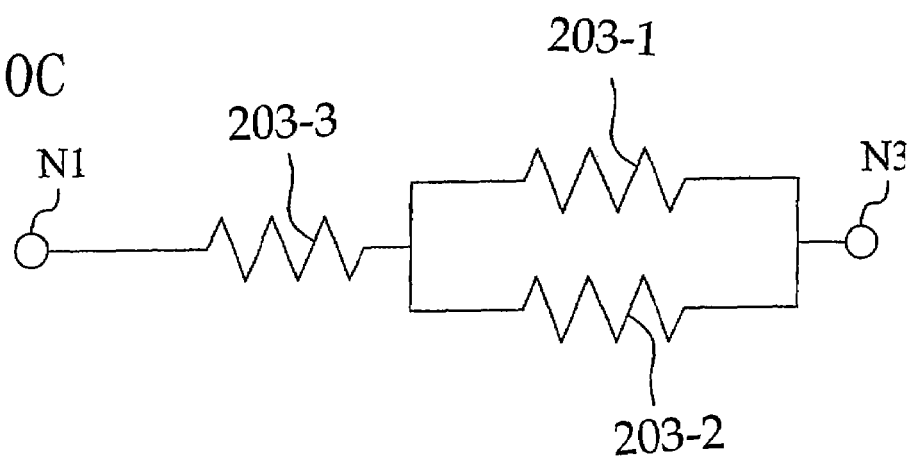

In the example of FIG. 10C, the resistive element 25 includes resistors 203-1, 203-2 and 203-3. The resistor 203-1 and the resistor 203-2 are connected in parallel between the node N3 and the resistor 203-3. The resistor 203-3 is connected between the node N1 and the resistors 203-1 and 203-2. At least one of the resistors 203-1, 203-2 and 203-3 is the diffused resistor 201, while each of the remaining resistors is the resistor 202 (a resistor having a characteristic opposite to that of the diffused resistor 201).

By combining various resistors, the variation amount as to the voltage-dependence characteristic (or temperature-dependence characteristic) of the resistive element 25 can be adjusted arbitrarily.

<Effects of Transistors 26-P and 26-N>

Next, the effects of the P-type MOS transistor 26-P and N-type MOS transistor 26-N shown in FIG. 6 are described with reference to the waveform charts of FIG. 11A and FIG. 11B.

Figure 11B:
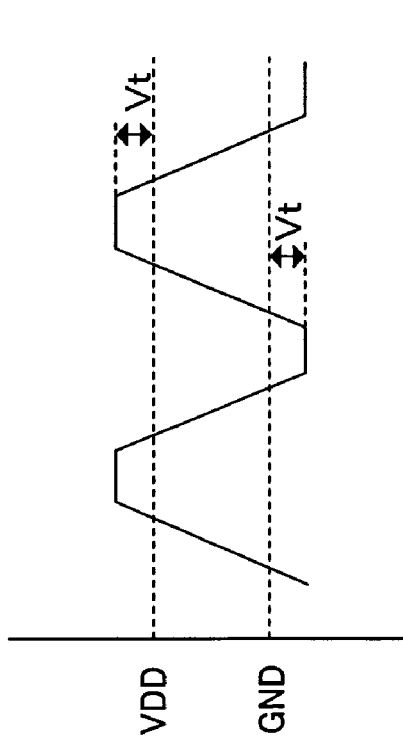
FIG. 11B is a graph showing a voltage variation at node N4.
Figure 11A:
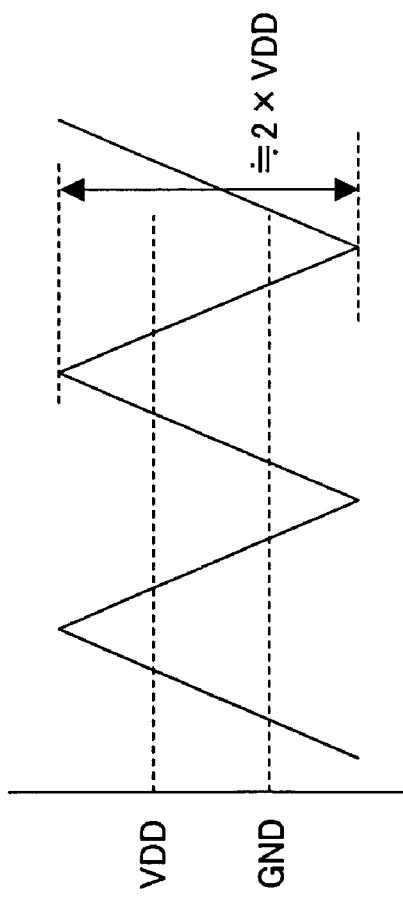
FIG. 11A is a graph showing a voltage variation at node N4.
Figure 12:
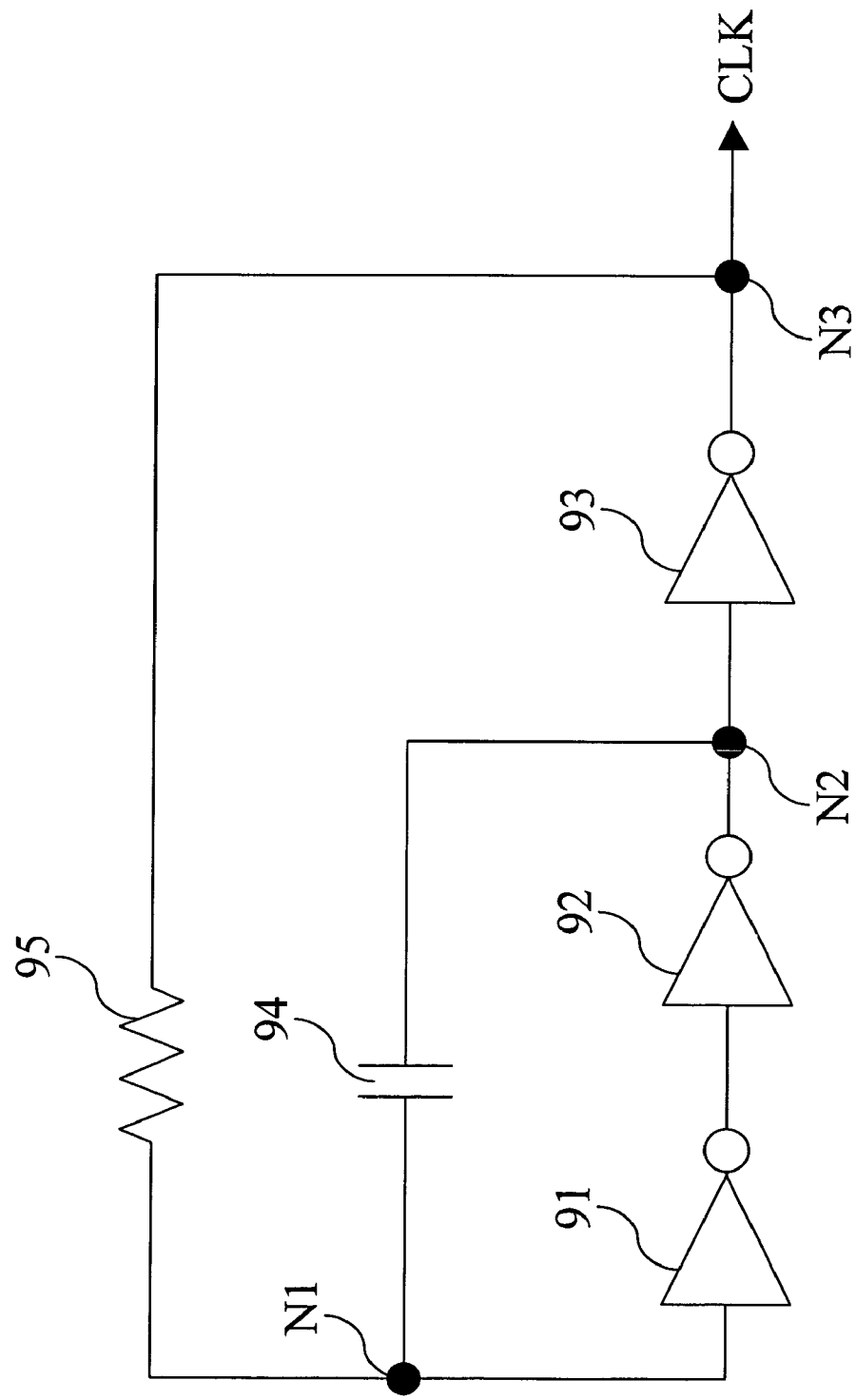
FIG. 12 is a circuit diagram showing the structure of a conventional CR oscillation circuit.

FIG. 11A is a waveform chart where the CR oscillation circuit does not include a P-type MOS transistor 26-P or N-type MOS transistor 26-N. In this case, the amplitude of the voltage at the node N4 is about twice that of the supply voltage ($\approx$2×VDD). Thus, there is a possibility that the node N4 results in an overvoltage because of the characteristics of the oscillation operation of the CR oscillation circuit.

FIG. 11B is a waveform chart where each of the P-type MOS transistor 26-P and N-type MOS transistor 26-N is connected to the node N4. In this case, the amplitude of the voltage at the node N4 is about VDD+2×Vt where "Vt" is the threshold level of the P-type MOS transistor 26-P and N-type MOS transistor 26-N. That is, the amplitude of the voltage at the node N4 is relatively small as compared with the example of FIG. 11A.

As described above, the overvoltage at the node N4 is reduced by connecting to the node N4 the P-type MOS transistor 26-P and N-type MOS transistor 26-N in each of which the gate and source are connected to each other. Thus, the voltage resistance breakdown at the input of the inverter can be prevented.

It should be noted that the same effects can also be achieved when the P-type MOS transistor 26-P and N-type MOS transistor 26-N are connected to the CR oscillation circuit of FIG. 1.

A CR oscillation circuit of the present invention is capable of suppressing a variation of a clock due to a voltage variation or temperature variation and is useful for a display device for high-definition pictures which requires stable supply of a clock.

What is claimed is:

1. A CR oscillation circuit comprising:
   a first logic element having an input terminal connected to a first node and an output terminal connected to a second node;
   a second logic element having an input terminal connected to the second node and an output terminal connected to a third node;
   a capacitive element connected between the first node and the second node in parallel with the first logic element; and
   a resistive element connected between the first node and the third node in parallel with the first and second logic elements, wherein the capacitive element includes
  a well formed in a semiconductor substrate,
  a diffusion layer formed in the well, the diffusion layer being electrically connected to any one of the first node and the second node,
  a gate electrode formed on the well and the diffusion layer, the gate electrode being electrically connected to the other one of the first node and the second node, and
  a gate oxide film formed between the well and the gate electrode,
each of the first and second logic elements has a voltage-dependence characteristic such that its on-resistance varies according to a variation in a supply voltage,
the capacitive element has a voltage-dependence characteristic such that its capacitance value varies according to the variation in the supply voltage, and
a capacitance value of the capacitive element decreases when the on-resistance of the first and second logic elements increases according to the variation in the supply voltage, and
wherein a variation amount of the capacitance value of the capacitive element which is determined according to a variation amount of the supply voltage is increased or decreased by forming at least one opening in the gate electrode.

2. A CR oscillation circuit comprising:
a first logic element having an input terminal connected to a first node and an output terminal connected to a second node;
a second logic element having an input terminal connected to the second node and an output terminal connected to a third node;
a capacitive element connected between the first node and the second node in parallel with the first logic element; and
a resistive element connected between the first node and the third node in parallel with the first and second logic elements,
wherein the capacitive element includes
  a well formed in a semiconductor substrate,
  a diffusion layer formed in the well, the diffusion layer being electrically connected to any one of the first node and the second node,
  a gate electrode formed on the well and the diffusion layer, the gate electrode being electrically connected to the other one of the first node and the second node, and
  a gate oxide film formed between the well and the gate electrode,
each of the first and second logic elements has a voltage-dependence characteristic such that its on-resistance varies according to a variation in a supply voltage,
the capacitive element has a voltage-dependence characteristic such that its capacitance value varies according to the variation in the supply voltage, and
a capacitance value of the capacitive element decreases when the on-resistance of the first and second logic elements increases according to the variation in the supply voltage, and
wherein:
  the gate electrode is formed by a plurality of electrodes; and
  a variation amount of the capacitance value of the capacitive element which is determined according to a variation amount of the supply voltage is increased or decreased by adjusting the number of said plurality of electrodes.

3. A CR oscillation circuit comprising:
a first logic element having an input terminal connected to a first node and an output terminal connected to a second node;
a second logic element having an input terminal connected to the second node and an output terminal connected to a third node;
a capacitive element connected between the first node and the second node in parallel with the first logic element; and
a resistive element connected between the first node and the third node in parallel with the first and second logic elements,
wherein the capacitive element includes
  a well formed in a semiconductor substrate,
  a diffusion layer formed in the well, the diffusion layer being electrically connected to any one of the first node and the second node,
  a gate electrode formed on the well and the diffusion layer, the gate electrode being electrically connected to the other one of the first node and the second node, and
  a gate wide film formed between the well and the gate electrode,
each of the first and second logic elements has a voltage-dependence characteristic such that its on-resistance varies according to a variation in a supply voltage,
the capacitive element has a voltage-dependence characteristic such that its capacitance value varies according to the variation in the supply voltage, and
a capacitance value of the capacitive element decreases when the on-resistance of the first and second logic elements increases according to the variation in the supply voltage, and
wherein the capacitive element further includes:
  a potential-fixed diffusion layer formed in the semiconductor substrate; and
  a resistive element connected between the potential-fixed diffusion layer and a predetermined fixed potential.

4. A CR oscillation circuit, comprising:
a first logic element having an input terminal connected to a first node and an output terminal connected to a second node;
a second logic element having an input terminal connected to the second node and an output terminal connected to a third node;
a capacitive element connected between the first node and the second node in parallel with the first logic element; and
a resistive element connected between the first node and the third node in parallel with the first and second logic elements,
wherein the resistive element includes a diffused resistor formed in a semiconductor substrate, the diffused resistor being electrically connected to each of the first node and the third node,
each of the first and second logic elements has a voltage-dependence characteristic such that its on-resistance varies according to a variation in a supply voltage,
the resistive element has a voltage-dependence characteristic such that its resistance value varies according to the variation in the supply voltage, and a resistance value of the resistive element decreases when the on-resistance of the first and second logic elements increases according to the variation in the supply voltage, and wherein:

the resistive element further includes a resistor which has a voltage-dependence characteristic such that its resistive value varies according to the variation in the supply voltage; and a resistance value of the resistor decreases when a resistance value of the diffused resistor increases according to the variation in the supply voltage.

5. The CR oscillation circuit of claim 4, wherein:

the capacitive element includes:

a well formed in the semiconductor substrate, a diffusion layer formed in the well, the diffusion layer being electrically connected to any one of the first node and the second node, a gate electrode formed on the well and the diffusion layer, the gate electrode being electrically connected to the other one of the first node and the second node, and a gate oxide film formed between the well and the gate electrode;

wherein:

the capacitive element has a voltage-dependence characteristic such that its capacitance value varies according to the variation in the supply voltage; and a capacitance value of the capacitive element decreases when the on-resistance of the first and second logic elements increases according to the variation in the supply voltage.

6. A CR oscillation circuit, comprising:

a first logic element having an input terminal connected to a first node and an output terminal connected to a second node;

a second logic element having an input terminal connected to the second node and an output terminal connected to a third node;

a capacitive element connected between the first node and the second node in parallel with the first logic element; and a resistive element connected between the first node and the third node in parallel with the first and second logic elements, wherein the resistive element includes a diffused resistor formed in a semiconductor substrate, the diffused resistor being electrically connected to each of the first node and the thin node, each of the first and second logic elements has a temperature-dependence characteristic such that its on-resistance varies according to a temperature variation, the resistive element has a temperature-dependence characteristic such that its resistance value varies according to the temperature variation, and a resistance value of the resistive element decreases when the on-resistance of the first and second logic elements increases according to the temperature variation, and wherein:

the resistive element further includes a resistor which has a temperature-dependence characteristic such that its resistive value varies according to the temperature variation; and a resistance value of the resistor decreases when a resistance value of the diffused resistor increases according to the temperature variation.

7. The CR oscillation circuit of claim 6, wherein:

the capacitive element includes:

a well formed in the semiconductor substrate, a diffusion layer formed in the well, the diffusion layer being electrically connected to any one of the first node and the second node, a gate electrode formed on the well and the diffusion layer, the gate electrode being electrically connected to the other one of the first node and the second node, and a gate oxide film formed between the well and the gate electrode;

each of the first and second logic elements has a voltage-dependence characteristic such that its on-resistance varies according to a variation in a supply voltage;

the capacitive element has a voltage-dependence characteristic such that its capacitance value varies according to the variation in the supply voltage; and a capacitance value of the capacitive element decreases when the on-resistance of the first and second logic elements increases according to the variation in the supply voltage.

8. The CR oscillation circuit of claim 4, wherein the diffused resistor is a P-type or N-type diffusion layer formed in the semiconductor substrate.

9. The CR oscillation circuit of claim 4, wherein the diffused resistor is a P-type or N-type well formed in the semiconductor substrate.

10. The CR oscillation circuit of claim 1, further comprising:

a P-type MOS transistor connected between a power supply node and a fourth node, the fourth node existing between the first node and an input of the first logic circuit, a source and a gate of the P-type MOS transistor being connected to each other; and an N-type MOS transistor connected between the fourth node and a ground node, a source and a gate of the N-type MOS transistor being connected to each other.

11. The CR oscillation circuit of claim 6, wherein the diffused resistor is a P-type or N-type diffusion layer formed in the semiconductor substrate.

12. The CR oscillation circuit of claim 6, wherein the diffused resistor is a P-type or N-type well formed in the semiconductor substrate.

13. The CR oscillation circuit of claim 4, further comprising:

a P-type MOS transistor connected between a power supply node and a fourth node, the fourth node existing between the first node and an input of the first logic circuit, a source and a gate of the P-type MOS transistor being connected to each other; and an N-type MOS transistor connected between the fourth node and a ground node, a source and a gate of the N-type MOS transistor being connected to each other.

14. The CR oscillation circuit of claim 6, further comprising:

a P-type MOS transistor connected between a power supply node and a fourth node, the fourth node existing between the first node and an input of the first logic circuit, a source and a gate of the P-type MOS transistor being connected to each other; and an N-type MOS transistor connected between the fourth node and a ground node, a source and a gate of the N-type MOS transistor being connected to each other.

15. The CR oscillation circuit of claim 2, further comprising:

a P-type MOS transistor connected between a power supply node and a fourth node, the fourth node existing between the first node and an input of the first logic circuit, a source and a gate of the P-type MOS transistor being connected to each other; and an N-type MOS transistor connected between the fourth node and a ground node, a source and a gate of the N-type MOS transistor being connected to each other.

16. The CR oscillation circuit of claim 1, wherein the resistive element is a P-type or N-type well formed in the semiconductor substrate.

17. The CR oscillation circuit of claim 2, wherein the resistive element is a P-type or N-type well formed in the semiconductor substrate.

* * * * *